(12) United States Patent
Yoo et al.

(10) Patent No.: US 12,278,091 B2
(45) Date of Patent: Apr. 15, 2025

(54) SUBSTRATE PROCESSING APPARATUS AND SUBSTRATE PROCESSING METHOD

(71) Applicant: PSK INC., Hwaseong-si (KR)

(72) Inventors: Kwang Sung Yoo, Hwaseong-si (KR); A Ram Kim, Hwaseong-si (KR); Song I Han, Hwaseong-si (KR)

(73) Assignee: PSK INC., Gyeonggi-do (KR)

( * ) Notice: Subject to any disclaimer, the term of this patent is extended or adjusted under 35 U.S.C. 154(b) by 220 days.

(21) Appl. No.: 17/536,518

(22) Filed: Nov. 29, 2021

(65) Prior Publication Data

US 2023/0068224 A1  Mar. 2, 2023

(30) Foreign Application Priority Data

Aug. 31, 2021  (KR) .................. 10-2021-0115655

(51) Int. Cl.
H01J 37/32 (2006.01)
(52) U.S. Cl.
CPC .... H01J 37/3244 (2013.01); H01J 37/32532 (2013.01); H01J 37/32715 (2013.01); *H01J 2237/06375* (2013.01); *H01J 2237/327* (2013.01)
(58) Field of Classification Search
CPC ............. H01J 37/3244; H01J 37/32532; H01J 37/32715; H01J 2237/06375; H01J 2237/327; H01J 37/32385; H01L 21/67069
USPC ..... 118/723 E, 723 ER; 156/345.43, 345.44, 156/345.45, 345.46, 345.47
See application file for complete search history.

(56) References Cited

U.S. PATENT DOCUMENTS

| 7,033,444 B1* | 4/2006 | Komino | C23C 16/46 |
| | | | 118/724 |
| 2002/0129902 A1* | 9/2002 | Babayan | H01J 37/32009 |
| | | | 156/345.43 |
| 2002/0185228 A1* | 12/2002 | Chen | H01J 37/32174 |
| | | | 156/345.48 |
| 2008/0179948 A1* | 7/2008 | Nagarkatti | H03F 3/195 |
| | | | 307/18 |
| 2014/0020708 A1* | 1/2014 | Kim | H01J 37/32091 |
| | | | 134/1.1 |

(Continued)

FOREIGN PATENT DOCUMENTS

| KR | 10-2010-0088769 A | 8/2010 |
| KR | 10-2017-0072809 A | 6/2017 |
| KR | 102116474 B1 | 5/2020 |

OTHER PUBLICATIONS

Machine Translation for KR1020100088769 (Year: 2024).*
Korean Office Action dated Mar. 27, 2023 issued in corresponding Korean Appln. No. 10-2021-0115655.

*Primary Examiner* — Rudy Zervigon
(74) *Attorney, Agent, or Firm* — Harness, Dickey & Pierce, P.L.C.

(57) ABSTRACT

Provided is a substrate processing apparatus including: a chuck configured to support a substrate; a dielectric plate disposed to face an upper surface of the substrate supported by the chuck; a gas supply unit configured to supply process gas to an edge region of the substrate; and a first edge electrode configured to generate plasma from the process gas to the edge region of the substrate supported by the chuck, in which the first edge electrode includes: a plurality of electrode units; and one or more insulating units provided between the electrode units.

17 Claims, 9 Drawing Sheets

(56) References Cited

U.S. PATENT DOCUMENTS

2015/0318150 A1* 11/2015 Fischer ............ H01J 37/32568
  156/345.28
2019/0122867 A1* 4/2019 Nam ................. H01J 1/025

* cited by examiner

SUBSTRATE PROCESSING APPARATUS AND SUBSTRATE PROCESSING METHOD

CROSS-REFERENCE TO RELATED APPLICATIONS

This application claims priority to and the benefit of Korean Patent Application No. 10-2021-0115655 filed in the Korean Intellectual Property Office on Aug. 31, 2021, the entire contents of which are incorporated herein by reference.

TECHNICAL FIELD

The present invention relates to a substrate processing apparatus and a substrate processing method.

BACKGROUND ART

Plasma refers to an ionized gas state formed of ions, radicals, electrons, and the like, and is generated by a very high temperature, strong electric fields, or RF electromagnetic fields. A semiconductor device manufacturing process includes an ashing or etching process of removing a membrane on a substrate by using plasma. The ashing or etching process is performed when ions and radical particles contained in the plasma collide or react with the membrane on the substrate. The process of processing the substrate by using the plasma is performed by various methods.

In the meantime, in a bevel etch process, a membrane in an edge region of a substrate is removed by transmitting plasma to the edge region of the substrate. In the bevel etch process, it is necessary to adjust a region (etching region) processed by plasma and the degree (etching rate) of processing by plasma as necessary. For example, it may be necessary to broad or narrow the range processed by the plasma as necessary. Further, it may be necessary to increase or decrease the degree to which the membrane is removed by the plasma as necessary.

In general, in order to adjust the etching region, the components of a bevel etch device that performs the bevel etch process are replaced. However, although the etching region may be adjusted in this method, it is difficult to adjust the etching rate.

SUMMARY OF THE INVENTION

The present invention has been made in an effort to provide a substrate processing apparatus and a substrate processing method which are capable of efficiently processing a substrate.

The present invention has also been made in an effort to provide a substrate processing apparatus and a substrate processing method which are capable of adjusting an etching rate in processing an edge region of a substrate with plasma.

The present invention has also been made in an effort to provide a substrate processing apparatus and a substrate processing method which are capable of adjusting an etching rate of a substrate while the substrate is processed.

The present invention has also been made in an effort to provide a substrate processing apparatus and a substrate processing method which are capable of providing an additional control factor in controlling plasma generated in an edge region of the substrate.

The problem to be solved by the present invention is not limited to the above-mentioned problems, and the problems not mentioned will be clearly understood by those skilled in the art from the present specification and the accompanying drawings.

An exemplary embodiment of the present invention provides an apparatus for processing a substrate. The apparatus includes: a chuck configured to support a substrate; a dielectric plate disposed to face an upper surface of the substrate supported by the chuck: a gas supply unit configured to supply process gas to an edge region of the substrate; and a first edge electrode configured to generate plasma from the process gas to the edge region of the substrate supported by the chuck, in which the first edge electrode may include: a plurality of electrode units; and one or more insulating units provided between the electrode units.

According to the exemplary embodiment, the apparatus may further include: an impedance adjustment module configured to adjust impedance including the electrode units; a tuning channel that is a channel for connecting the electrode unit and the impedance adjustment module: a ground channel configured to ground the electrode unit; and a channel distributor module configured to distribute the electrode unit to any one selected between the tuning channel and the ground channel.

According to the exemplary embodiment, the channel distributor module may include a plurality of switches corresponding to the electrode units, respectively, and one end of the ground channel may be connected with a ground, and the other end may be branched and is connected with the plurality of switches, respectively.

According to the exemplary embodiment, the apparatus may further include a connection line for connecting the electrode unit and the switch.

According to the exemplary embodiment, the insulating unit may be made of a material including at least one of $ZrO_2$, AlN, $Al_2O_3$ polyethylene terephthalate (PETE), and Poly EtheretherKetone (PEEK).

According to the exemplary embodiment, the electrode units may have an arc shape when viewed from above, and be arranged while being spaced apart from each other in a circumferential direction of the arc.

According to the exemplary embodiment, the electrode units may have a ring shape when viewed from above.

According to the exemplary embodiment, the electrode units may have the same center and have different radii when viewed from above.

According to the exemplary embodiment, the gas supply unit may include: a first gas supply unit for supplying inert gas to a center region of the substrate supported by the chuck; and a second gas supply unit for supplying the process gas to the edge region of the substrate supported by the chuck.

According to the exemplary embodiment, the first edge electrode may be an upper edge electrode disposed above the substrate supported by the chuck.

According to the exemplary embodiment, the apparatus may further include a lower edge electrode disposed below the substrate supported by the chuck.

According to the exemplary embodiment, the apparatus may further include a driving member configured to move the chuck in a vertical direction.

Another exemplary embodiment of the present invention provides a method of processing a substrate by using the apparatus for processing the substrate. The method includes: seating the substrate on the chuck: supplying the process gas to the edge region of the substrate: generating the plasma to the edge region of the substrate: processing the substrate by the plasma; and switching at least one among the switches for distributing the electrode units to the ground channel or the tuning channel.

According to another exemplary embodiment, the switching may be performed while the substrate is processed by the plasma.

According to another exemplary embodiment, the method may further include adjusting the impedance of the electrode unit, in which the adjusting of the impedance may be performed while the substrate is processed by the plasma.

According to the exemplary embodiment of the present invention, it is possible to efficiently process a substrate.

Further, according to the exemplary embodiment of the present invention, it is possible to adjust an etching rate in processing an edge region of a substrate by plasma.

Further, according to the exemplary embodiment of the present invention, it is possible to adjust an etching rate of a substrate while the substrate is processed.

Furthermore, according to the exemplary embodiment of the present invention, it is possible to provide an additional control factor for controlling plasma generated in an edge region of a substrate.

The effect of the present invention is not limited to the foregoing effects, and the not-mentioned effects will be clearly understood by those skilled in the art from the present specification and the accompanying drawings.

DETAILED DESCRIPTION

Figure 1:
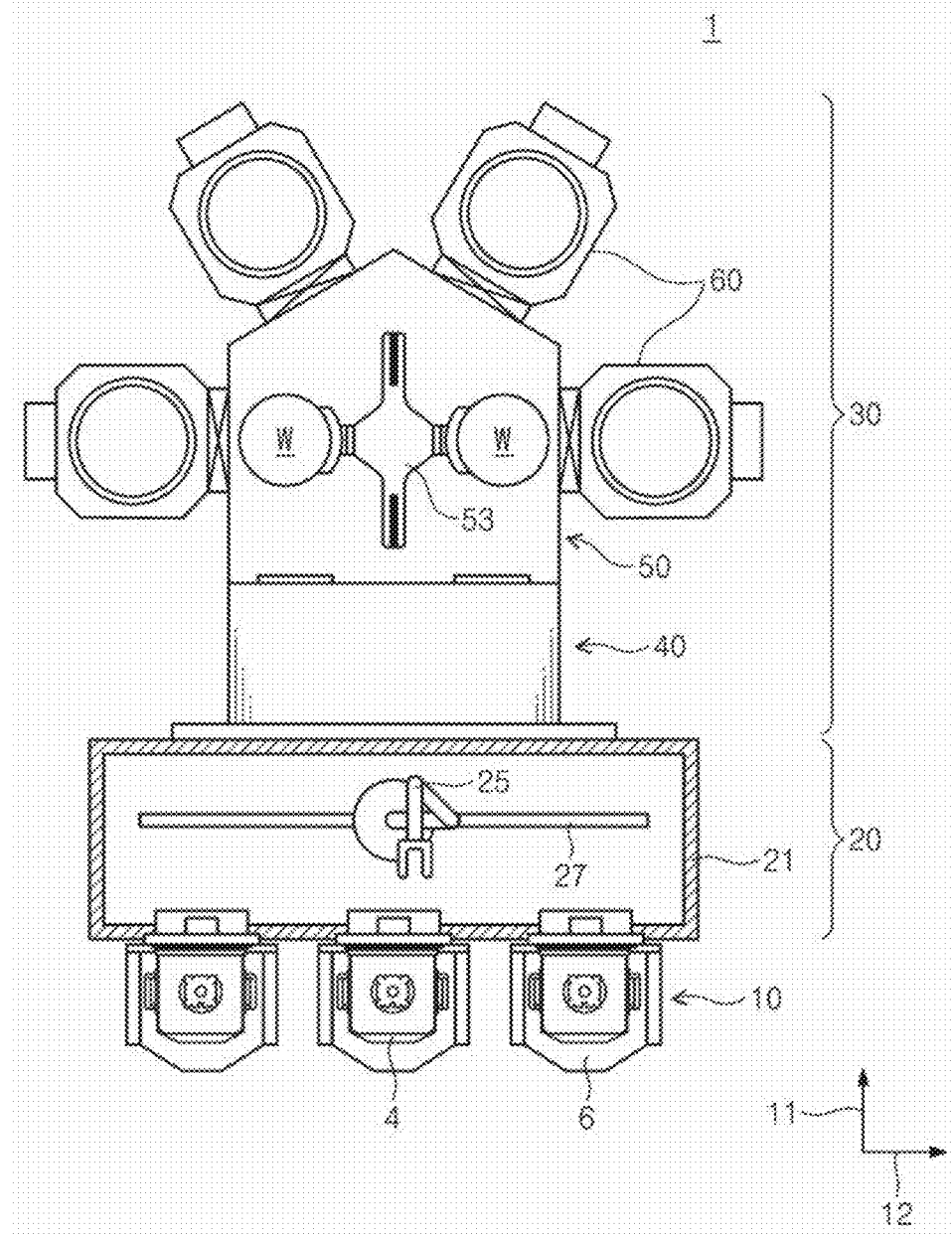
FIG. 1 is a diagram schematically illustrating substrate processing equipment according to an exemplary embodiment of the present invention.

Hereinafter, an exemplary embodiment of the present invention will be described more fully hereinafter with reference to the accompanying drawings, in which exemplary embodiments of the invention are shown. However, the present invention can be variously implemented and is not limited to the following embodiments. In the following description of the present invention, a detailed description of known functions and configurations incorporated herein is omitted to avoid making the subject matter of the present invention unclear. In addition, the same reference numerals are used throughout the drawings for parts having similar functions and actions.

Unless explicitly described to the contrary, the word "comprise" and variations such as "comprises" or "comprising", will be understood to imply the inclusion of stated elements but not the exclusion of any other elements. It will be appreciated that terms "including" and "having" are intended to designate the existence of characteristics, numbers, steps, operations, constituent elements, and components described in the specification or a combination thereof, and do not exclude a possibility of the existence or addition of one or more other characteristics, numbers, steps, operations, constituent elements, and components, or a combination thereof in advance.

Singular expressions used herein include plurals expressions unless they have definitely opposite meanings in the context. Accordingly, shapes, sizes, and the like of the elements in the drawing may be exaggerated for clearer description.

Hereinafter, an exemplary embodiment of the present invention will be described in detail with reference to FIGS. 1 to 12.

FIG. 1 is a diagram schematically illustrating substrate processing equipment according to an exemplary embodiment of the present invention. Referring to FIG. 1, substrate processing equipment 1 has an equipment front end module (EFEM) 20 and a processing module 30. The EFEM 20 and the processing module 30 are disposed in one direction.

The EFEM 20 includes a load port 10 and a transfer frame 21. The load port 10 is disposed in front of the EFEM 20 in a first direction 11. The load port 10 includes a plurality of support parts 6. The support parts 6 are disposed in series in a second direction 12, and a carrier 4 (for example, a cassette, and an FOUP) in which a substrate W that is to be provided for a process and a processing completed substrate W is accommodated is seated on each support part 6. In the carrier 4, the substrate W that is to be provided for a process and the process completed substrate W are accommodated. The transfer frame 21 is disposed between the load port 10 and the processing module 30. The transfer frame 21 includes a first transfer robot 25 which is disposed inside the transfer frame 21 and transfers the substrate W between the load port 10 and the processing module 30. The first transfer robot 25 moves along a transfer rail 27 provided in the second direction 12 to transfer the substrate W between the carrier 4 and the processing module 30.

The processing module 30 includes a load lock chamber 40, a transfer chamber 50, and a process chamber 60. The processing module 30 may process the substrate W by receiving the substrate W from the EFEM 20.

The load lock chamber 40 is disposed to be adjacent to the transfer frame 21. For example, the load lock chamber 40 may be disposed between the transfer chamber 50 and the EFEM 20. The load lock chamber 40 provides a place in which the substrate W to be provided for the process stands by before being transferred to the process chamber 60, or the processing completed substrate W stands by before being transferred to the EFEM 20.

The transfer chamber 50 may transfer the substrate W. The transfer chamber 50 is disposed to be adjacent to the load lock chamber 40. The transfer chamber 50 has a polygonal body when viewed from above. Referring to FIG. 1, the transfer chamber 50 has a pentagonal body when viewed from above. At the external side of the body, the load lock chamber 40 and the plurality of process chambers 60 are disposed along a circumference of the body. A passage (not illustrated) through which the substrate W enters and exists is formed on each sidewall of the body, and the passage connects the transfer chamber 50 and the load lock chamber 40 or the process chambers 60. Each passage is provided with a door (not illustrated) which opens/closes the passage to seal the inside. The second transfer robot 53 which transfers the substrate W between the load lock chamber 40 and the process chambers 60 is disposed in an internal space of the transfer chamber 50. The second transfer robot 53 transfers the unprocessed substrate W waiting in the load lock chamber 40 to the process chamber 60 or transfers the process completed substrate W to the load lock chamber 40. Further, the second transfer robot 53 may bring the substrate W into an internal space 102 of a housing 100 which is to be described below, or take out the substrate W from the internal space 102. Further, the second transfer robot 53 may transfer the substrate W between the process chambers 60 in order to sequentially provide the plurality of process chambers 60 with the substrate W. As illustrated in FIG. 1, when the transfer chamber 50 has the pentagonal body, the load lock chamber 40 is disposed on the sidewall adjacent to the EFEM 20, and the process chambers 60 are consecutively disposed on the remaining sidewalls. The transfer chamber 50 may be provided in various forms depending on a demanded process module, as well as the foregoing shape.

The process transfer chamber 60 may be disposed to be adjacent to the transfer chamber 50. The process chambers 60 are disposed along the circumference of the transfer chamber 50. The plurality of process chambers 60 may be provided. In each process chamber 60, the process processing for the substrate W may be performed. The process chamber 60 may receive the substrate W from the second transfer robot 53 and perform the process processing, and provides the second transfer robot 53 with the substrate W for which the process processing is completed. The process processing performed in the process chambers 60 may be different from each other.

Hereinafter, a substrate processing apparatus 1000 performing a plasma process in the process chamber 60 will be described. Further, the substrate processing apparatus 1000 which is to be described below will be described based on the configuration capable of performing a plasma processing process on an edge region of a substrate in the process chamber 60 as an example. However, the present invention is not limited thereto, and the substrate processing apparatus 1000 which is to be described below may be equally or similarly applied to various chambers in which substrate processing is performed. Further, the substrate processing apparatus 1000 may be equally or similarly applied to various chambers in which a plasma processing process is performed on the substrate.

Figure 2:
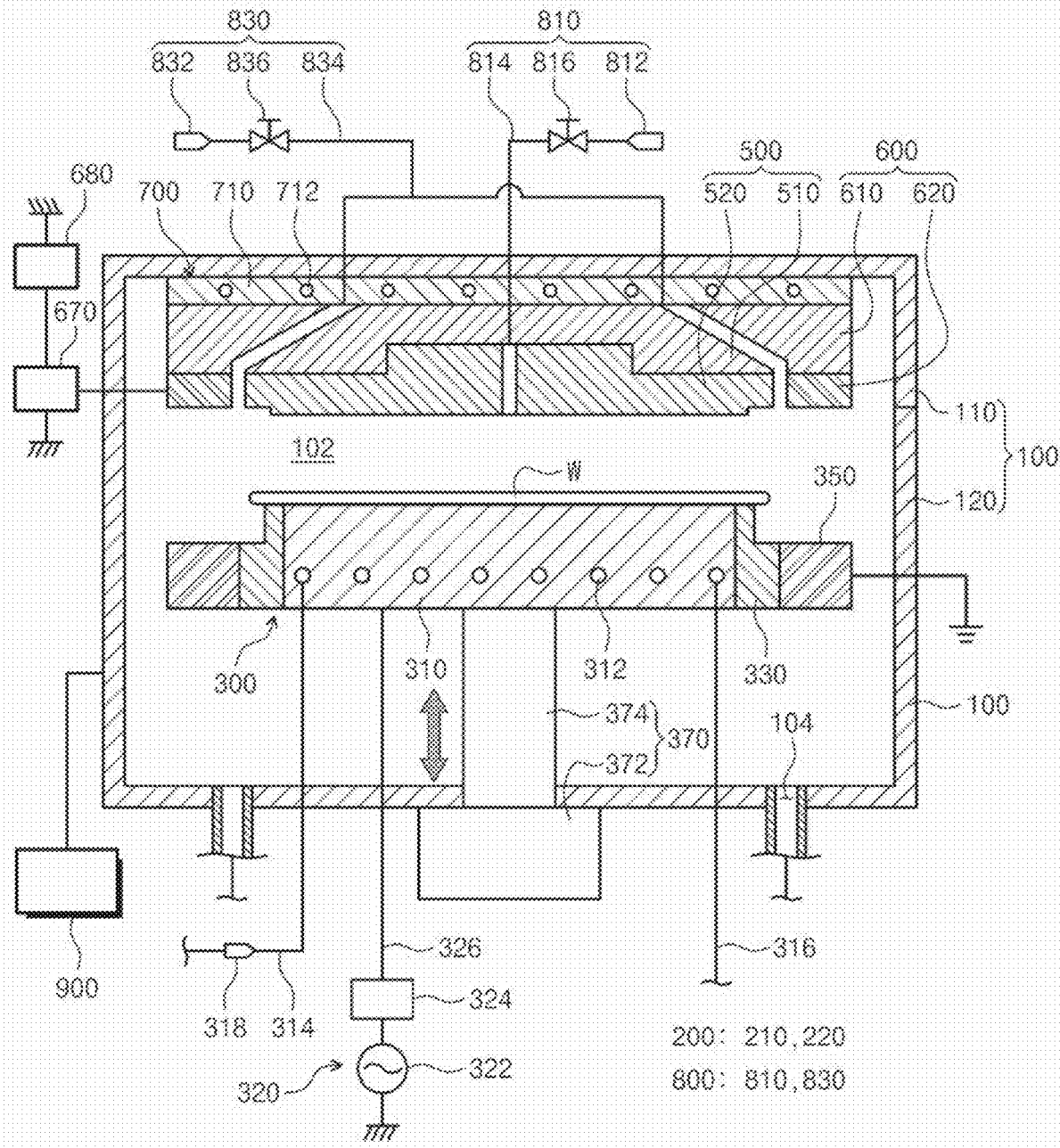
FIG. 2 is a cross-sectional view illustrating an exemplary embodiment of a substrate processing apparatus provided to a process chamber of FIG. 1.

FIG. 2 is a diagram illustrating an exemplary embodiment of the substrate processing apparatus provided to the process chamber of FIG. 1. Referring to FIG. 2, the substrate processing apparatus provided to the process chamber 60 performs a predetermined process on the substrate W by using plasma. For example, the substrate processing apparatus may etch or ash a membrane on the substrate W. The membrane may be various types of membrane, such as a poly silicon film, a silicon oxide film, a silicon nitride film. Further, the membrane may be a natural oxide film or a chemically produced oxide film. Further, the membrane may be a by-product generated in a process of processing the substrate W. Further, the membrane may be impurities attached and/or left on the substrate W.

The substrate processing apparatus may perform a plasma process on the substrate W. For example, the substrate processing apparatus may process the substrate W by supplying process gas and generating plasma from the supplied process gas. The substrate processing apparatus may process an edge region of the substrate W by supplying process gas and generating plasma from the supplied process gas. Hereinafter, the present invention will be described based on an example in which the substrate processing apparatus is a bevel etch device performing etching processing on the edge region of the substrate W.

The substrate processing apparatus may include a housing 100, a support unit 300, a dielectric plate unit 500, an upper electrode unit 600, a temperature adjustment unit 700, a gas supply unit 800, and a controller 900.

The housing 100 may define the internal space 102. The housing 100 may include an upper housing 110 (an example of a first housing) and a lower housing 110 (an example of a second housing). The upper housing 110 and the lower housing 120 may be combined with each other to define the internal space 102. Further, the upper housing 110 may be rotatably fastened to the lower housing 120 by a rotation coupling part (not illustrate), such as a hinge mechanism.

The upper housing 110 may be in an open position or a closed position. The position of the upper housing 110 which is combined with the lower housing 120 to define the internal space 102 is defined as the closed position, and the position of the upper housing 110 at which the internal space 102 is exposed to the outside is defined as the open position.

Further, an atmosphere of the internal space 102 is isolated from the outside when the upper housing 110 is in the closed position, and the internal space 102 isolated from the outside may be adjusted to a low-pressure state (vacuum atmosphere) closed to vacuum while the substrate W is processed. Further, the housing 100 may be made of a material including metal. Further, an inner surface of the housing 100 may be coated with an insulating material. Further, the housing 100 may be grounded.

Further, the housing 100 may be a vacuum chamber. For example, an exhaust hole 104 may be formed in a bottom surface of the housing 100. Plasma P generated in the internal space 102 or gas G1 and G2 supplied to the internal space 102 may be exhausted to the outside through the exhaust hole 104. Further, by-products generated in the process of processing the substrate W by using the plasma P may be discharged to the outside through the exhaust hole 104. Further, the exhaust hole 104 may be connected with an exhaust line. The exhaust line may be connected with a decompression member (not illustrated) providing decompression. The decompression member may provide decompression to the internal space 102 through the exhaust line.

The support unit 300 may support the substrate W in the internal space 102. The support unit 300 may include a chuck 310, a power supply member 320, an insulating ring 330, a lower edge electrode 350 (an example of a second edge electrode), and a driving member 370.

The chuck 310 may support the substrate W in the internal space 102. The chuck 310 may have a support surface supporting the substrate W. The chuck 310 may have a circular shape when viewed from above. The chuck 310 may have a diameter smaller than a diameter of the substrate W when viewed above. Accordingly, a center region of the substrate W supported by the chuck 310 is seated on the support surface of the chuck 310, and an edge region of the substrate W may not be in contact with the support surface of the chuck 310.

A heating means (not illustrated) may be provided inside the chuck 310. The heating means (not illustrated) may heat the chuck 310. The heating means may be a heater. Further, a cooling flow path 312 may be formed in the chuck 310. The cooling flow path 312 may be formed inside the chuck 310. A cooling fluid supply line 314 and a cooling fluid discharge line 316 may be connected to the cooling flow path 312. The cooling fluid supply line 314 may be connected with a cooling fluid supply source 318. The cooling fluid supply source 318 may store a cooling fluid and/or supply a cooling fluid to the cooling fluid supply line 314. Further, the cooling fluid supplied to the cooling flow path 312 may be discharged to the outside through the cooling fluid discharge line 316. The cooling fluid stored in and/or supplied by the cooling fluid supply source 318 may be cooling water or cooling gas. Further, the shape of the cooling flow path 312 formed in the chuck 310 is not limited to the shape illustrated in FIG. 2, and may be variously transformed. Further, the configuration of cooling the chuck 310 is not limited to the configuration of supplying the cooling fluid, and may also be provided with various configurations (for example, a cooling plate) which are capable of cooling the chuck 310.

The power supply member 320 may supply RF power to the chuck 310. The power supply member 320 may include a power supply 322, a matcher 324, and a power supply line 326. The power supply 322 may be a bias power supply. Further, the power supply 332 may be an RF power supply. The power supply 322 may be connected with the chuck 310 via the power supply line 326. Further, the matcher 324 is provided to the power supply line 326 to perform impedance matching.

The insulating ring 330 may be provided to have a ring shape when viewed from above. For example, the insulating ring 330 may be provided to surround the chuck 310 when viewed from above. For example, the insulating ring 330 may have a ring shape. The insulating ring 330 may be made of a material having an insulating property.

The lower edge electrode 350 may be formed to surround the insulating ring 330 when viewed from above. The lower edge electrode 350 may have a ring shape when viewed from above. The lower edge electrode 350 may be grounded. The lower edge electrode 350 may be disposed in a lower portion of the edge region of the substrate W supported by the chuck 310 when viewed from above. The lower portion of the edge region of the substrate W may be the region overlapping the edge region of the substrate W and may also be the region not-overlapping the edge region of the substrate W when viewed from above.

The driving member 370 may lift the chuck 310. The driving member 370 may include a driver 372 and a shaft 374. The shaft 374 may be coupled with the chuck 310. The shaft 374 may be connected with the driver 372. The driver 372 may move up and down the chuck 310 in the vertical direction via the shaft 374. The driving member 370 moves up and down the chuck 310, so that a gap between the upper surface of the substrate W supported by the chuck 310 and a lower surface of a dielectric plate 520 may be adjusted.

The dielectric plate unit 500 may include the dielectric plate 520 and a first base 510. Further, the dielectric plate unit 500 may be coupled to a temperature adjustment plate 710 which is to be described below.

The dielectric plate 520 may be disposed so that a lower surface thereof faces an upper surface of the chuck 310. The dielectric plate 520 may have a circular shape when viewed from above. Further, the upper surface of the dielectric plate 520 may be stepped so that a height of a center region thereof is greater than a height of the edge region. Further, the lower surface of the dielectric plate 520 may be provided in a flat shape. Further, the edge region in the lower surface of the dielectric plate 520 may be stepped so that the height thereof is greater than that of the center region. The plasma P, which will be described below, is allowed to enter the stepped region in the lower surface of the dielectric plate 520 to increase processing efficiency for the edge region of the substrate W.

The dielectric plate 520 may be disposed so as to face the upper surface of the substrate W supported by the support unit 300, particularly, the chuck 310, in the internal space 102. The dielectric plate 520 may be disposed above the support unit 300. The dielectric plate 520 may be made of a material including ceramic. A gas flow path connected with a first gas supply unit 810 of the gas supply unit 800, which will be described below, may be formed in the dielectric plate 520. Further, a discharge end of the gas flow path may be configured so that first gas G1 supplied by the first gas supply unit 810 is supplied to the center region of the substrate W supported by the support unit 300. Further, the discharge end of the gas flow path may be configured so that the first gas G1 is supplied to the upper surface of the center region of the substrate W supported by the support unit 300.

The first base 510 may be disposed between the dielectric plate 520 and the temperature adjustment plate 710 which is to be described below. The first base 510 may be coupled to the temperature adjustment plate 710 which is to be described below, and the dielectric plate 520 may be coupled to the first base 510. Accordingly, the dielectric plate 520 may be coupled to the temperature adjustment plate 710 via the first base 510.

The diameter of the first base 510 may gradually increase from top to bottom. The diameter of the upper surface of the first base 510 may be smaller than the diameter of the lower surface of the dielectric plate 520. The upper surface of the first base 510 may have a flat shape. Further, a lower surface of the first base 510 may have a stepped shape. For example, the lower surface of the first base 510 may be stepped so that a height of the lower surface of the edge region of the first base 510 is smaller than a height of the lower surface of the center region. Further, the lower surface of the first base 510 and the upper surface of the dielectric plate 520 may have shapes that may be combined with each other. For example, the center region of the dielectric plate 520 may be inserted into the center region of the first base 510. Further, the first base 510 may be made of a material including metal. For example, the first base 510 may be made of a material including aluminum. The position of the dielectric plate 520 may be fixed by the first base 510.

The upper electrode unit 600 may include a second base 610, an upper edge electrode 620 (an example of the first edge electrode), a connection line 640, a ground channel 650, a tuning channel 660, a channel distributor module 670, and an impedance adjustment module 680.

The upper edge electrode 620 may have a shape surrounding the dielectric plate 520 when viewed from above. The upper edge electrode 620 may have a ring shape when viewed from above. The upper edge electrode 620 may be provided to be spaced apart from the dielectric plate 520. The upper edge electrode 620 may be spaced apart from the dielectric plate 520 to form a space. The space may form a part of a gas channel in which second gas G2 supplied by a second gas supply unit 830, which will be described below, flows. A discharge end of the gas channel may be configured so that the second gas G2 is supplied to the edge region of the substrate W supported by the support unit 300. Further, the discharge end of the gas channel may be configured so that the second gas G2 is supplied to the upper surface of the edge region of the substrate W supported by the support unit 300.

The upper edge electrode 620 may be disposed above the substrate W supported by the chuck 310 when viewed from above. The upper edge electrode 620 may generate plasma to the edge region of the substrate W. The upper edge electrode 620 may generate plasma P from the process gas G2 supplied by the gas supply unit 800 which will be described below.

Figure 3:
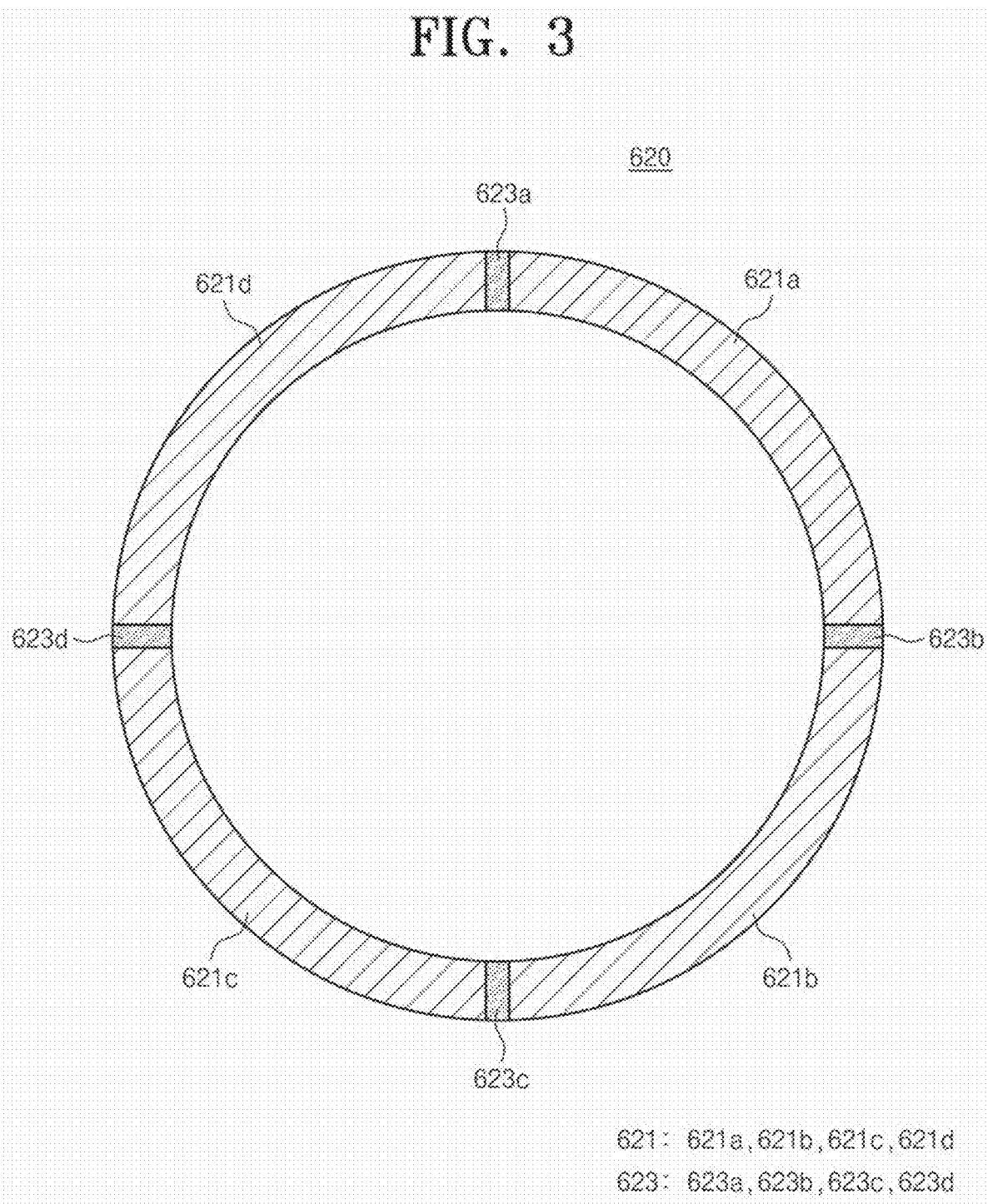
FIG. 3 is a diagram of an upper edge electrode of FIG. 2 viewed from above.

FIG. 3 is a diagram of the upper edge electrode of FIG. 2 viewed from above. Referring to FIG. 3, the upper edge electrode 620 includes an electrode unit 621 and an insulating unit 623.

At least one electrode unit 621 may be provided. The plurality of electrode units 621 may be provided. For example, the electrode units 621 may include a first electrode unit 621a, a second electrode unit 621b, a third electrode unit 621c, and a fourth electrode unit 621d. Each electrode unit 621 may have an arc shape. The insulating unit 623 may be provided between the electrode units 621. The insulating unit 623 may electrically separate the electrode units 621 from each other. At least one insulating unit 623 may be provided. The insulating unit 623 may include a first insulating unit 623a provided between the fourth electrode unit 621d and the first electrode unit 621a, a second insulating unit 623b provided between the first electrode unit 621a and the second electrode unit 621b, a third insulating unit 623c provided between the second electrode unit 621b and the third electrode unit 621c, and a fourth insulating unit 623d provided between the third electrode unit 621c and the fourth electrode unit 621d. Further, each of the electrode units 621 may have an arc shape when viewed from above, and the electrode units 621 may be arranged while being spaced apart from each other along a circumferential direction of the arc.

The electrode unit 621 may be made of a material through which electricity can flow, and the insulating unit 623 may include a material through which electricity cannot flow or electricity is extremely difficult to flow. For example, the surface of the insulating unit 623 may made of a material including at least one of $ZrO_2$, AlN, $Al_2O_3$ polyethylene terephthalate (PETE), and polyetheretherketone (PEEK).

The number of electrode units 621 and the number of insulating units 623 are the example, and may be variously changed as necessary.

Referring back to FIG. 2, the second base 610 may be installed above the chuck 310 and the substrate W supported by the chuck 310. The second base 610 may fix the position of the upper edge electrode 620. The second base 610 may be disposed between the upper edge electrode 620 and the temperature adjustment plate 710 which will be described below. The second base 610 may be coupled to the temperature adjustment plate 710 which will be described below and the upper edge electrode 620 may be coupled to the second base 610. Accordingly, the upper edge electrode 620 may be coupled to the temperature adjustment plate 710 via the second base 610.

The second base 610 may have a ring shape when viewed from above. The upper surface and the lower surface of the second base 610 may have a flat shape. When viewed from above, the second base 610 may have a shape surrounding the first base 510. An inner diameter of the second base 610 may gradually increase from top to bottom. The second base 610 may be provided to be spaced apart from the first base 510. The second base 610 may be spaced apart from the first base 510 to form a space. The space may form a part of the gas channel in which the second gas G2 supplied by the second gas supply unit 830, which will be described below, flows. Further, the second base 610 may be made of a material including metal. For example, the second base 610 may be made of a material including aluminum.

The channel distributor module 630 may ground the electrode unit 621 of the upper edge electrode 620 or selectively connect the electrode unit 621 of the upper edge electrode 620 to the impedance adjustment module 680. The impedance adjustment module 680 may adjust impedance of the electrode unit 621 of the upper edge electrode 620.

Figure 4:
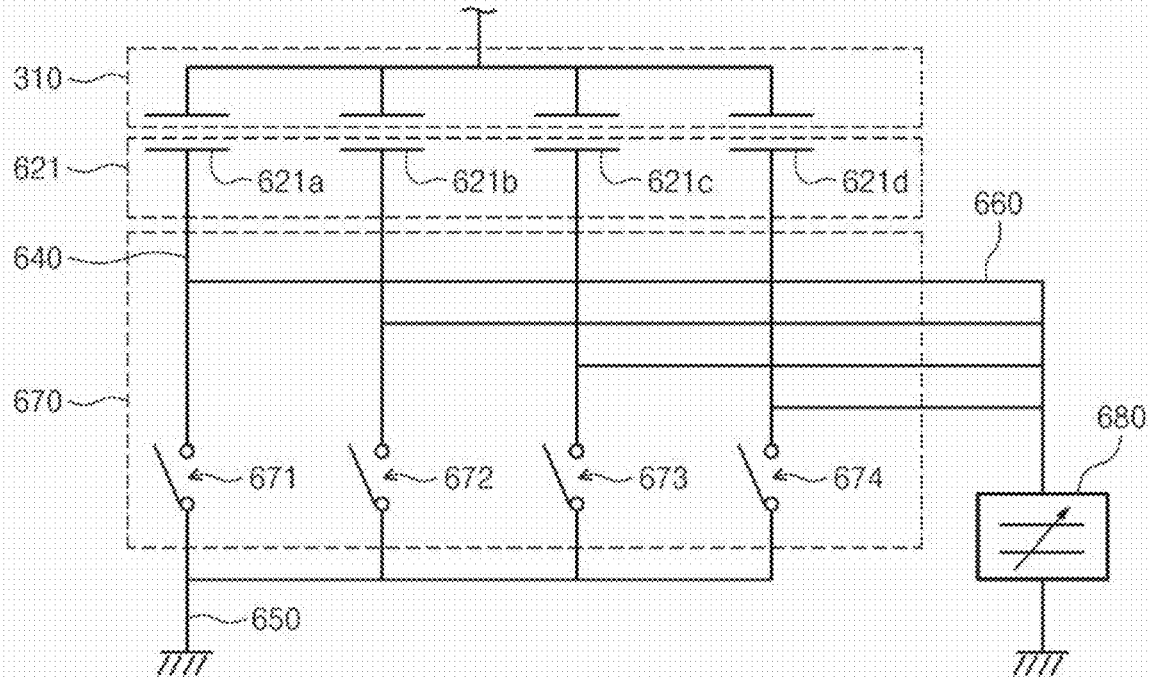
FIG. 4 is a diagram schematically illustrating a connection of the upper edge electrode, a channel distributor module, and an impedance adjustment module.

FIG. 4 is a diagram schematically illustrating a connection of the upper edge electrode, the channel distributor module, and the impedance adjustment module. Referring to FIG. 4, each of the electrode units 621 of the upper edge electrode 620 may be connected with the power supply member 320 to oppose the chuck 310 capable of playing a role of a cathode or the substrate W supported by the chuck 310.

The electrode units 621 may be connected with the plurality of switches 671, 672, 673, and 674 of the channel distributor module 670, which will be described below, by the connection line 640, respectively.

The channel distributor module 670 may include the plurality of switches 671, 672, 673, and 674 which may correspond to the electrode units 621, respectively. For example, the channel distributor module 670 may include a first switch 671 corresponding to the first electrode unit 621a, a second switch 672 corresponding to the second electrode unit 621b, a third switch 673 corresponding to the third electrode unit 621c, and fourth switch 674 corresponding to the fourth electrode unit 621d. The number of switches of the channel distributor module 670 may be variously changed as necessary. According to the switching of the plurality of switches 671, 672, 673, and 674 of the channel distributor module 670, the electrode units 621 may be distributed to the ground channel 650 or may be distributed to the tuning channel 660.

For example, when it is desired to distribute the first electrode unit 621a to the fourth electrode unit 621d to the tuning channel 660, all of the plurality of switches 671, 672, 673, and 674 may be turned off.

Contrary to this, when it is desired to distribute the first electrode unit 621a to the fourth electrode unit 621d to the ground channel 650, all of the plurality of switches 671, 672, 673, and 674 may be turned on.

Further, the case where some of the plurality of switches 671, 672, 673, and 674 are distributed to the ground channel 650 and the others are distributed to the tuning channel 660 may be considered. For example, when it is desired to distribute only the first electrode unit 621a to the ground channel, the first electrode unit 621a may be distributed to the ground channel by turning on the first switch 671, and the others may be distributed to the tuning channel 660 by turning off the second switch 672 to the fourth switch 674.

That is, through the combination of on/off of the first switch 671, the second switch 672, the third switch 673, and the fourth switch 674, each of the first electrode unit 621*a* to the fourth electrode unit 621*d* may be distributed to the channel selected between the ground channel 650 and the tuning channel 660.

The electrode units 621 distributed to the ground channel 650 may be grounded. One end of the ground channel 650 may be connected to the ground, and the other end may be branched and connected to the switches 671, 672, 673, and 674, respectively.

Impedance of the electrode units 621 distributed to the tuning channel 660 may be adjusted by the impedance adjustment module 680.

Further, each of the plurality of switches 671, 672, 673, and 674 may be formed of an electric relay or a mechanical relay. Further, each of the plurality of switches 671, 672, 673, and 674 may also be formed of a physical joint system without using an electric device.

The electrode units 621 may be grouped into N channels by the channel distributor module 670. For example, the electrode units 621 may be grouped into a first ground that is grounded, a second group which is connected with the impedance adjustment module 680 and of which an impedance size is adjusted to first impedance, and a third group which is connected with the impedance adjustment module 680 and of which an impedance size is adjusted to second impedance that is different from the first impedance. The grouping is illustrative, and the grouping method may be variously changed.

Referring back to FIG. 2, the temperature adjustment unit 700 may include the temperature adjustment plate 710, and a fluid supply unit (not illustrated) which supplies a cooling fluid (CF) to the temperature adjustment plate 710 and discharges the cooling fluid which has been circulated in the temperature adjustment plate 710 to have an increased temperature.

The temperature adjustment plate 710 may be coupled with the dielectric plate unit 500 and the upper electrode unit 600. The temperature adjustment plate 710 may be installed on a ceiling of the upper housing 110. The temperature adjustment plate 710 may be configured to be disposed in the internal space 102 when the upper housing 110 is in the closed position which defines the internal space 102. The temperature adjustment plate 710 may prevent the temperatures of the first base 510 and the second base 610 from excessively increasing. For example, a flow path 712 through which the cooling fluid flows, which will be described below, may be formed in the temperature adjustment plate 710. The cooling fluid may be cooling water. Contrary to this, the cooling fluid may be cooling gas.

According to the exemplary embodiment of the present invention, the first base 510 is disposed between the dielectric plate 520 and the temperature adjustment plate 710. The first base 510 may be made of a material different from that of the dielectric plate 520 and may be made of the same material as that of the temperature adjustment plate 710. That is, a thermal expansion coefficient of the first base 510 may be closer to a thermal expansion coefficient of the temperature adjustment plate 710 than a thermal expansion coefficient of the dielectric plate 520. That is, the first base 510 is disposed between the dielectric plate 520 and the temperature adjustment plate 710, so that it is possible to minimize distortion generated between the temperature adjustment plate 710 and the dielectric plate 520 due to cooling heat generated by the temperature adjustment plate 710. This is because the first base 510 that is in direct contact with the temperature adjustment plate 710 is made of a material similar to that of the temperature adjustment plate 710.

Similarly, according to the exemplary embodiment of the present invention, the second base 610 is disposed between the upper edge electrode 620 and the temperature adjustment plate 710. The second base 610 may be made of the material different from that of the upper edge electrode 620 and may be made of the same material as that of the temperature adjustment plate 710. That is, the thermal expansion coefficient of the second base 610 may be closer to the thermal expansion coefficient of the temperature adjustment plate 710 than the thermal expansion coefficient of the upper edge electrode 620. That is, the second base 610 is disposed between the upper edge electrode 620 and the temperature adjustment plate 710, thereby minimizing distortion between the temperature adjustment plate 710 and the upper edge electrode 620 by cooling heat generated by the temperature adjustment plate 710. This is because the second base 610 that is in direct contact with the temperature adjustment plate 710 is made of the material similar to that of the temperature adjustment plate 710.

The gas supply unit 800 may supply gas to the internal space 102. The gas supply unit 800 may supply the first gas G1 and the second gas G2 to the internal space 102. The gas supply unit 800 may include a first gas supply unit 810 and a second gas supply unit 830.

The first gas supply unit 810 may supply the first gas G1 to the internal space 102. The first gas G1 may be inert gas, such as nitrogen. The first gas supply unit 810 may supply the first gas G1 to the center region of the substrate W supported by the chuck 310. The first gas supply unit 810 may include a first gas supply source 812, a first gas supply line 814, and a first valve 816. The first gas supply source 812 may store the first gas G1 and/or supply the first gas G1 to the first gas supply line 814. The first gas supply line 814 may be connected with the flow path formed in the dielectric plate 520. The first valve 816 may be installed in the first gas supply line 814. The first valve 816 may be an on/off valve, or provided as a flow rate adjustment valve. The first gas G1 supplied by the first gas supply source 812 may be supplied to the center region of the upper surface of the substrate W through the flow path formed in the dielectric plate 520.

The second gas supply unit 830 may supply the second gas G2 to the internal space 102. The second gas G2 may be process gas excited to a plasma state. The second gas supply unit 830 may supply the second gas G2 to the edge region of the substrate W through the gas channel formed by spacing the dielectric plate 520, the first base 510, the upper edge electrode 620, and the second base 610 provided above the upper portion of the edge region of the substrate W supported by the chuck 310 apart from each other. The second gas supply unit 830 may include a second gas supply source 832, a second gas supply line 834, and a second valve 836. The second gas supply source 832 may store the second gas G2 and/or supply the second gas G2 to the second gas supply line 834. The second gas supply line 814 may supply the second gas G2 to the space functioning as the gas channel. The second valve 836 may be installed in the second gas supply line 834. The second valve 836 may be an on/off valve, or provided as a flow rate adjustment valve. The second gas G2 supplied by the second gas supply source 832 may be supplied to the edge region of the upper surface of the substrate W through the second flow path 602.

The controller 900 may control the substrate processing apparatus. The controller 900 may control the substrate processing apparatus so as to perform a plasma processing process performed below. For example, the controller 900 may control the gas supply unit 800, the temperature adjustment plate 710, and the support unit 300. For example, the controller 900 may control the support unit 300 and the gas supply unit 800 so that when the first gas supply unit 810 and/or the second gas supply unit 830 supplies gas, the power supply 322 applies power to the chuck 310 to generate plasma P in the edge region of the substrate W supported by the chuck 310.

The controller 900 may control the substrate processing apparatus so as to perform a substrate processing method to be described below. Further, the controller 900 may include a process controller formed of a microprocessor (computer) that executes the control of the substrate processing apparatus, a user interface formed of a keyboard in which an operator performs a command input operation or the like in order to manage the substrate processing apparatus 10, a display for visualizing and displaying an operation situation of the substrate processing apparatus, and the like, and a storage unit storing a control program for executing the process executed in the substrate processing apparatus 1000 under the control of the process controller or a program, that is, a processing recipe, for executing the process in each component according to various data and processing conditions. Further, the user interface and the storage unit may be connected to the process controller. The processing recipe may be stored in a storage medium in the storage unit, and the storage medium may be a hard disk, and may also be a portable disk, such as a CD-ROM or a DVD, or a semiconductor memory, such as a flash memory.

Figure 5:
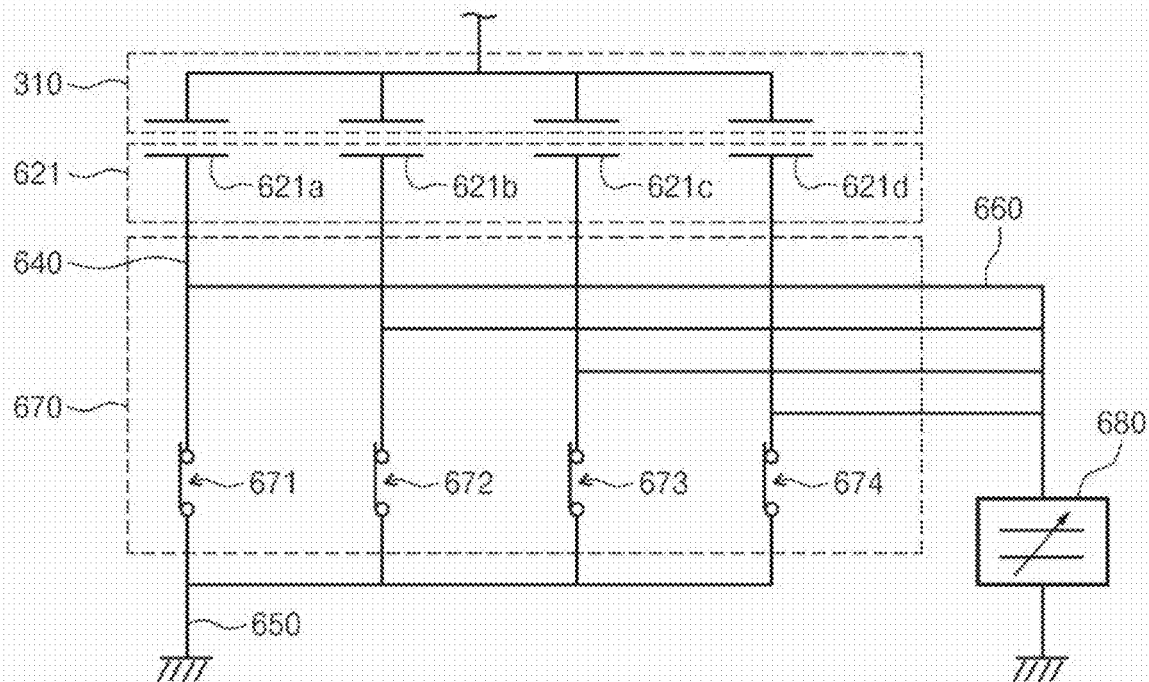
FIG. 5 is a diagram illustrating the state where electrode units of the upper edge electrode are grounded by the channel distributor module.
Figure 6:
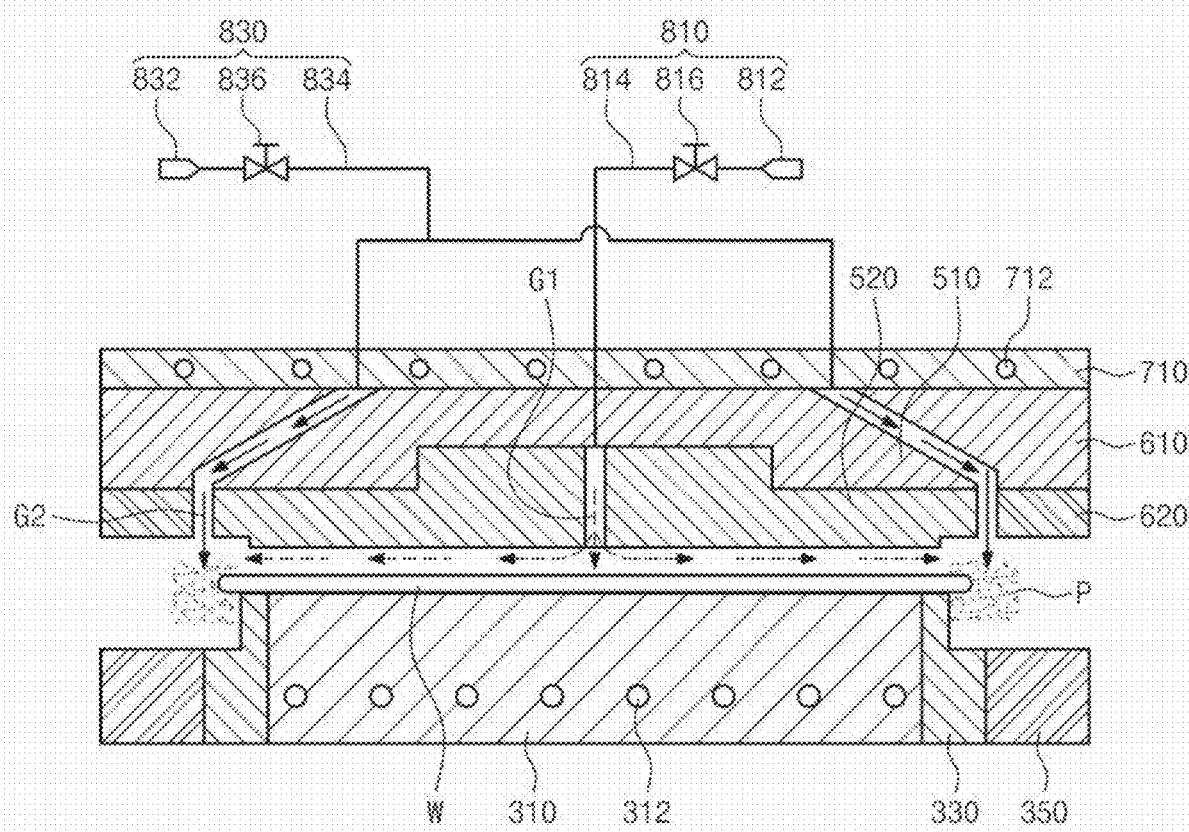
FIG. 6 is a diagram schematically illustrating the state where the substrate is processed when the electrode units are grounded.

FIG. 5 is a diagram illustrating the state where the electrode units of the upper edge electrode are grounded by the channel distributor module, and FIG. 6 is a diagram schematically illustrating the state where the substrate is processed when the electrode units are grounded.

Referring to FIGS. 5 and 6, the substrate processing apparatus 1000 according to the exemplary embodiment of the present invention may process the edge region of the substrate W. For example, the substrate processing apparatus 1000 may process the edge region of the substrate W by generating plasma P in the edge region of the substrate W. For example, the substrate processing apparatus 1000 may perform a bevel etch process of processing the edge region of the substrate W.

The bevel etch process may include an operation of seating the substrate W on the chuck 310, an operation of supplying the process gas G2 to the edge region of the substrate W, an operation of supplying the inert gas G1 to the center region of the substrate W, an operation of generating plasma P in the edge region of the substrate W, and an operation of processing the substrate W by the plasma.

When the substrate W is seated on the chuck 310, the driving member 370 may decrease the gap between the substrate W and the dielectric plate 520 by moving the chuck 310 in the upper direction in order to perform the bevel etch process on the substrate W.

When the substrate processing apparatus 1000 process the edge region of the substrate W, the first gas supply unit 810 may supply the first gas G1 to a center region of the substrate W and the second gas supply unit 830 may supply the second gas G2 to the edge region of the substrate W. The second gas G2 supplied by the second gas supply unit 830 is process gas, so that the second gas G2 may be excited in a plasma P state to process the edge region of the substrate W. For example, a thin film on the edge region of the substrate W may be etching-processed by the plasma P. Further, the first gas G1 supplied to the center region of the substrate W is inert gas, and the first gas G1 prevents the second gas G2 from being introduced to the center region of the substrate W, thereby further improving processing efficiency for the edge region of the substrate W.

Further, by the channel distributor module 670 and the impedance adjustment module 680 of the present invention, it is possible to adjust a density per unit area of the plasma P generated in the operation of generating the plasma P.

For example, when all of the electrode units 621 are grounded, the large amount of current may flow in the electrode units 621 per unit time. Accordingly, the density of the plasma P per unit area generated in the edge region of the substrate W and/or the size of the region in which the plasma P is generated may be relatively small.

Figure 7:
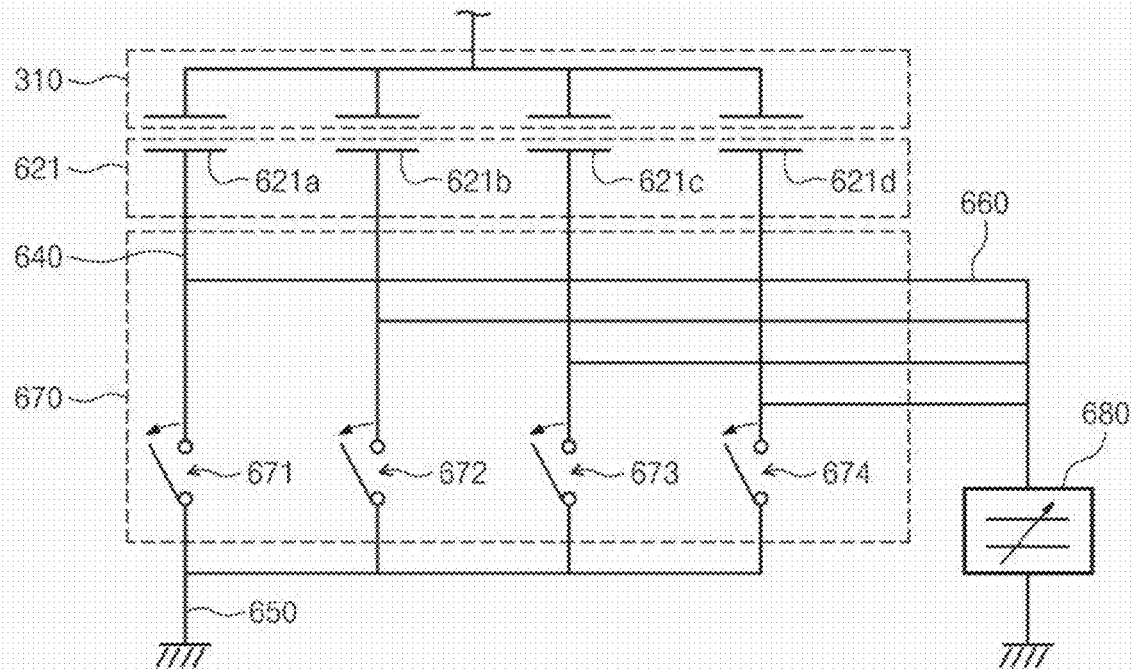
FIG. 7 is a diagram illustrating an example in which the electrode units of the upper edge electrode are electrically connected with the impedance adjustment module by the channel distributor module.
Figure 8:
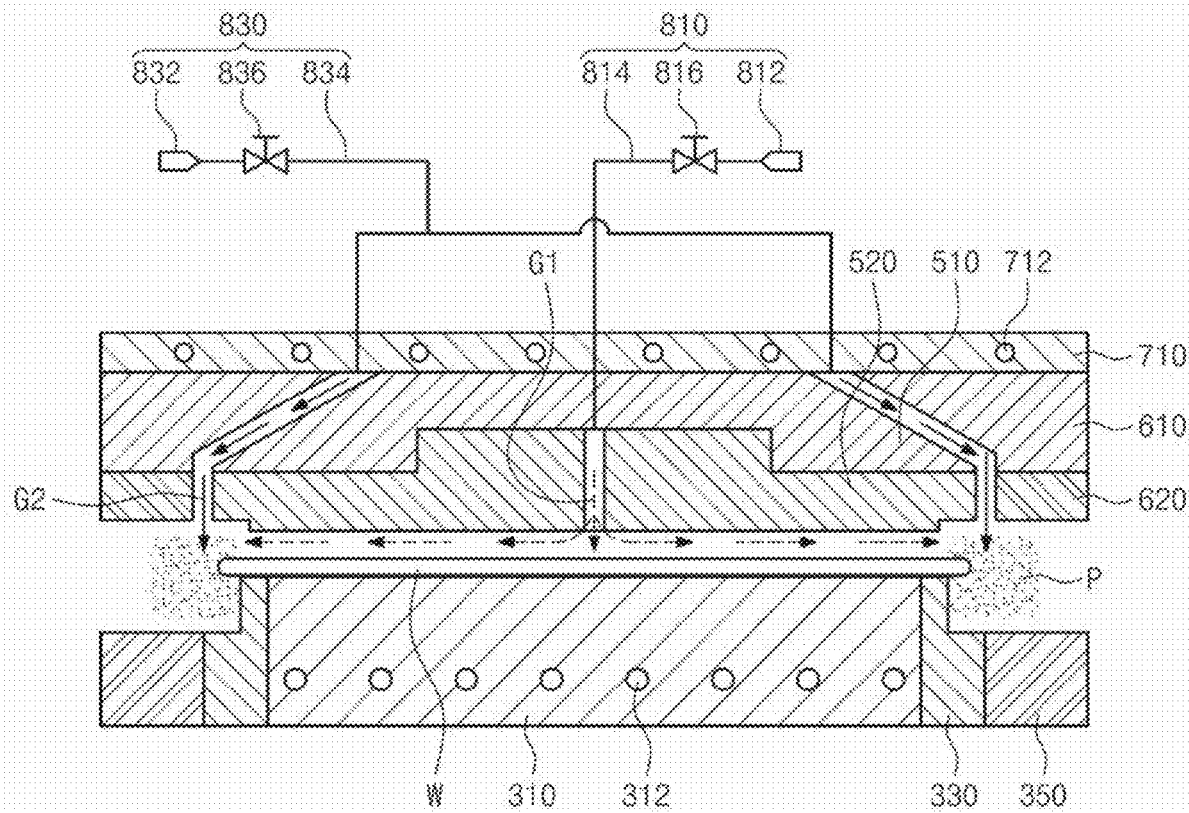
FIG. 8 is a diagram schematically illustrating the state where the substrate is processed when the electrode units are connected with the impedance adjustment module and impedance of the electrode unit is adjusted to a first size.

However, as illustrated in FIG. 7, in the case where all of the electrode units 621 are distributed to the tuning channel 660, the relatively small amount of current may flow in the electrode units 621 per unit time. Accordingly, as illustrated in FIG. 8, the density of the plasma P generated in the edge region of the substrate W per unit area and/or the size of the region in which the plasma P is generated may be relatively large. Further, the switching of the switches 671, 672, 673, and 674 may be performed while the substrate W is processed by the plasma P.

Figure 9:
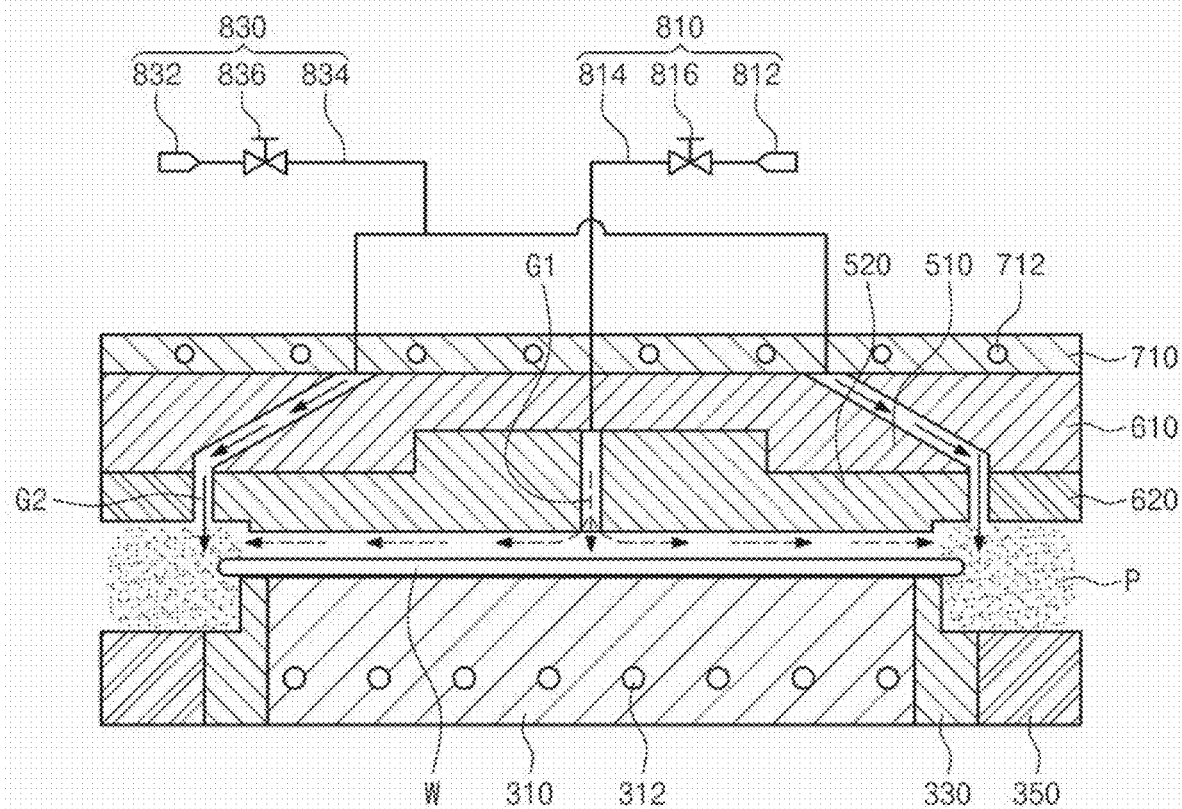
FIG. 9 is a diagram schematically illustrating the state where the substrate is processed when the electrode units are connected with the impedance adjustment module and impedance of the electrode unit is adjusted to a second size.

Further, as necessary, when it is desired to further adjust the density of the plasma P generated in the edge region of the substrate W, variable capacitance that impedance adjustment module 680 may have is changed, thereby changing the impedance of the electrode units 621. For example, when the impedance is further increased, less current flows per unit time, so that as illustrated in FIG. 9, the density of the plasma P generated in the edge region of the substrate W and/or the size of the region in which the plasma P is generated may be relatively large. Further, the operation of adjusting the impedance by the impedance adjustment module 680 may be performed while the substrate W is processed by the plasma P.

Figure 10:
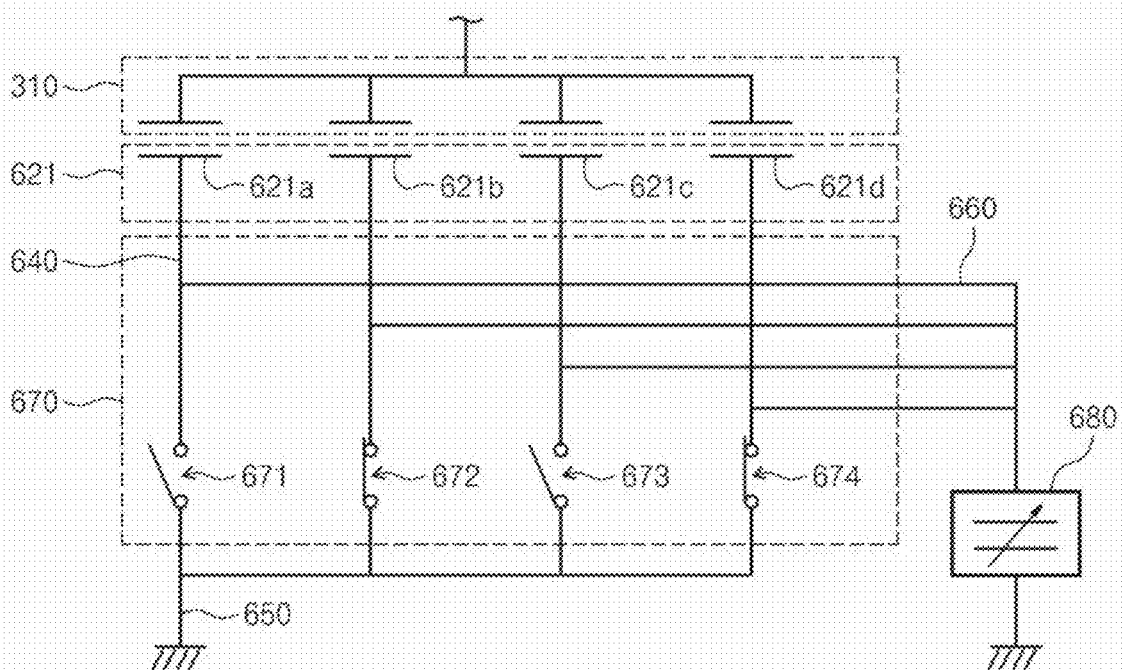
FIG. 10 is a diagram illustrating another example in which the electrode units of the upper edge electrode are electrically connected with the impedance adjustment module by the channel distributor module.

Further, in the foregoing example, the case where all of the electrode units 621 are grounded or are distributed to the tuning channel 600 has been described as the example, but the present invention is not limited thereto, and as illustrated in FIG. 10, some of the electrode units 621 may be distributed to the tuning channel 660 and the other may be distributed to the ground channel 650. Accordingly, an etching rate for the edge region of the substrate W viewed from above may be differently controlled in the circumferential direction of the substrate W.

That is, according to the exemplary embodiment of the present invention, it is possible to adjust the etching region or the uniformity of the etching rate of the substrate W without a replacement of the part, such as the upper edge electrode 620, the lower edge electrode 350, the dielectric plate 520, the chuck 310, and the insulating ring 330. Therefore, it is possible to save time required for replacing the part.

Further, it is possible to change the etching region or the etching rate while the substrate W is processed, thereby adjusting uniformity for the substrate W in real time while the substrate W is processed.

Figure 11:
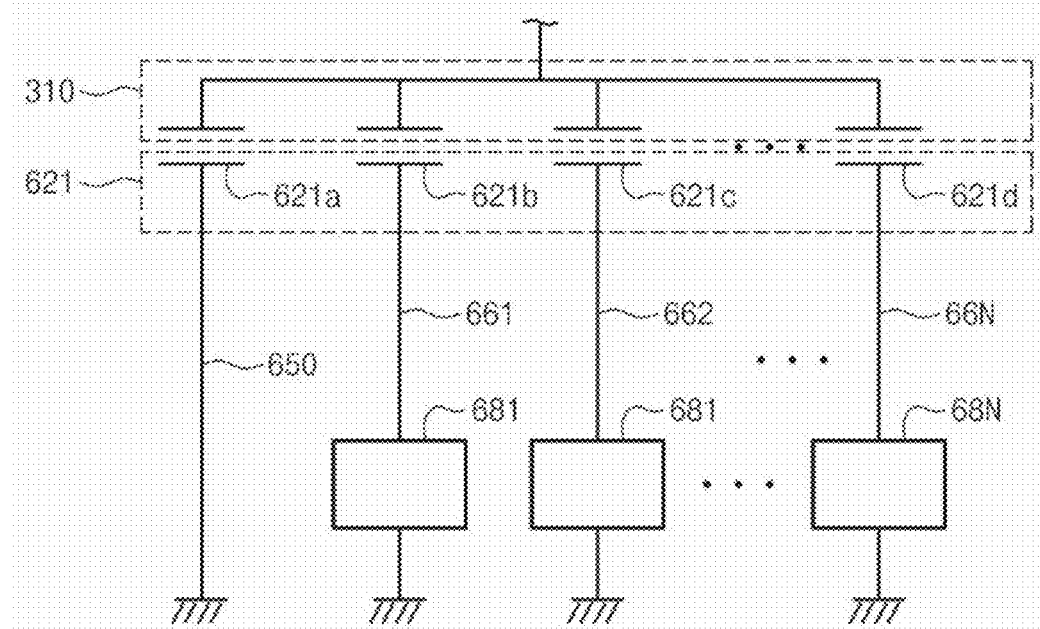
FIG. 11 is a diagram schematically illustrating another example of the connection of the upper edge electrode, the channel distributor module, and the impedance adjustment module.

In the foregoing example, the case where the channel distributor module 670 is provided has been described as the example, but the present invention is not limited thereto. For example, as illustrated in FIG. 11, the channel distributor module 670 may be omitted. Further, some of the electrode units 621 may be grounded. Further, the other of the electrode units 621 may be connected with different impedance adjustment members 681, 682, . . . , and 68N, so that the impedance may be adjusted.

Depending on the case, an exemplary embodiment in which all of the electrode units 621 are connected with the impedance adjustment members 681, 682, . . . , and 68N may also be considered. The impedance adjustment members 681, 682, . . . , and 68N may perform the same/similar function to that of the impedance adjustment module 680.

Figure 12:
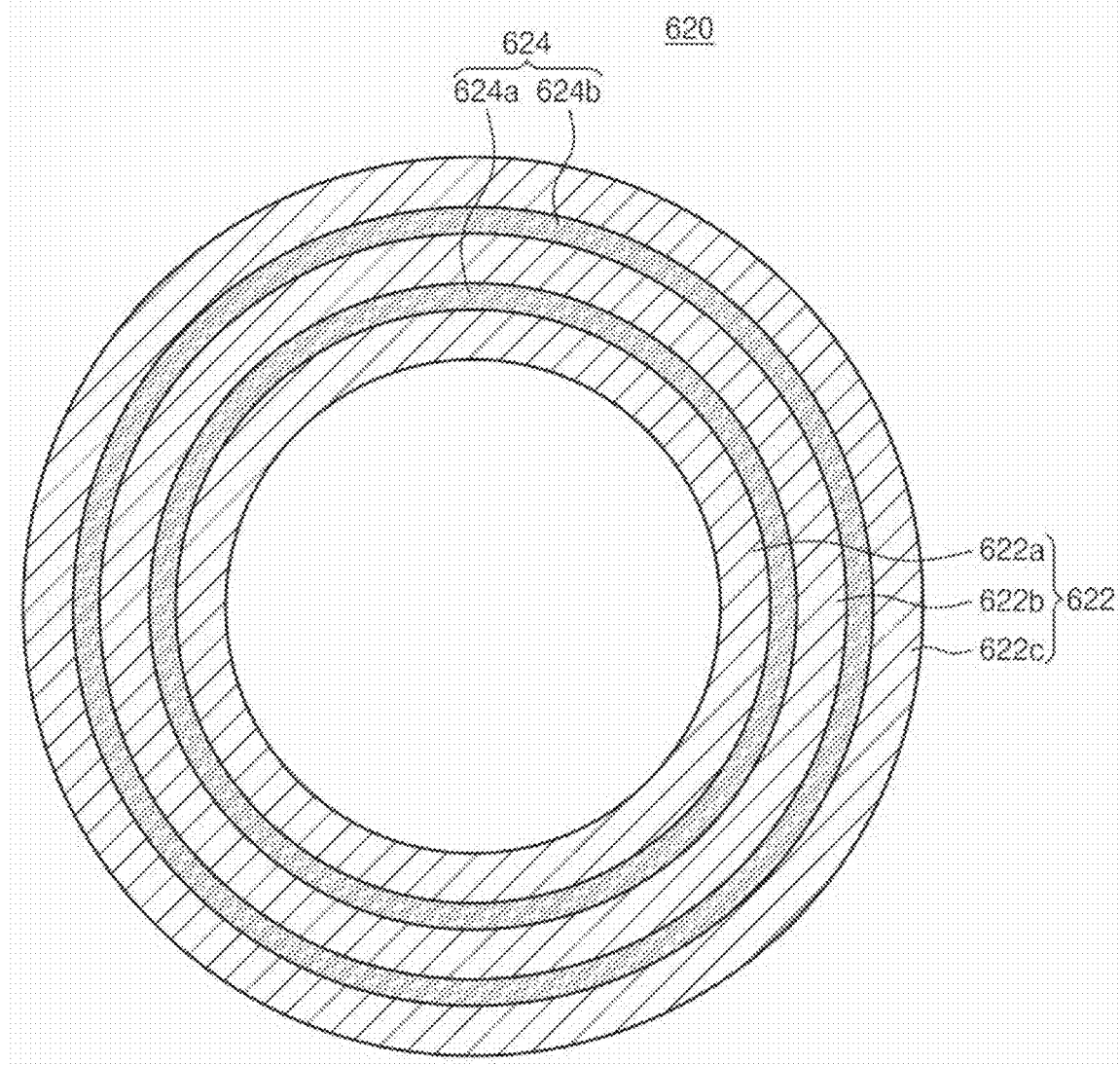
FIG. 12 is a diagram of an upper edge electrode according to another example viewed from above.

In the foregoing example, the case where the electrode units 621 have the arc shape and are arranged in the circumferential direction of the arc while being spaced apart from each other has been described as the example, but the present invention is not limited thereto. For example, as illustrated in FIG. 12, the electrode units 622 may include a first electrode unit 622a, a second electrode unit 622b, and a third electrode unit 622c having a ring shape. A first insulating unit 624a may be disposed between the first electrode unit 622a and the second electrode unit 622b, and a second insulating unit 624b may be disposed between the second electrode unit 622b and the third electrode unit 622c. Each of the electrode units 622 and the insulating units 624 has a ring shape, and the electrode units 622 and the insulating units 624 may be disposed so as to have the same center when viewed from above, and may have different diameters. Further, the electrode units 622 and the insulating units 624 may be alternatively disposed in a radius direction of the ring when viewed from above. In this case, the degree of processing, that is, the etching rate, by the plasma P may be adjusted in the radius direction of the substrate W.

The insulating units may be disposed between the electrode units to prevent the electrode units from being electrically connected with each other.

In the foregoing example, the chase where the chuck 310 moves in the vertical direction and the positions of the dielectric plate 520 and the upper edge electrode 620 are fixed has been described as the example, but the present invention is not limited thereto. For example, the position of the chuck 310 may be fixed and the dielectric plate 520 may be configured to be movable in the vertical direction. Further, both the chuck 310 and the dielectric plate 520 may be configured to be movable in the vertical direction.

The method of generating the plasma P by the substrate processing apparatus 1000 described in the foregoing example may be an Inductive Coupled Plasma (ICP) method. Further, the method of generating the plasma P by the substrate processing apparatus 1000 may be a Capacitor Couple Plasma (CCP) method. Further, the substrate processing apparatus 1000 may generate the plasma P by using both the ICP method and the CCP method or by using a selected method between the ICP method and the CCP method. Further, the substrate processing apparatus 1000 may also generate the plasma P by using a remote plasma method.

The foregoing detailed description illustrates the present invention. Further, the above content shows and describes the exemplary embodiment of the present invention, and the present invention can be used in various other combinations, modifications, and environments. That is, the foregoing content may be modified or corrected within the scope of the concept of the invention disclosed in the present specification, the scope equivalent to that of the disclosure, and/or the scope of the skill or knowledge in the art. The foregoing exemplary embodiment describes the best state for implementing the technical spirit of the present invention, and various changes required in the specific application field and use of the present invention are possible. Accordingly, the detailed description of the invention above is not intended to limit the invention to the disclosed exemplary embodiment. Further, the accompanying claims should be construed to include other exemplary embodiments as well.

What is claimed is:

1. An apparatus for processing a substrate, the apparatus comprising:
a chuck configured to support a substrate;
a dielectric plate configured to face an upper surface of the substrate supported by the chuck;
a gas supply unit configured to supply a process gas to an edge region of the substrate; and
a first edge electrode configured to generate plasma from the process gas to the edge region of the substrate supported by the chuck,
wherein the first edge electrode includes
a plurality of electrode units, and
one or more insulating units between the plurality of electrode units,
wherein the first edge electrode is an upper edge electrode disposed above the substrate supported by the chuck,
wherein the apparatus further comprises:
a lower edge electrode disposed below the substrate supported by the chuck;
an impedance adjustment module configured to adjust impedance of the plurality of the electrode units;
a tuning channel connecting the plurality of electrode units and the impedance adjustment module;
a ground channel configured to ground the plurality of electrode units; and
a channel distributor module configured to distribute the electrode unit to any one selected between the tuning channel and the ground channel, and
wherein the upper edge electrode is configured to face the lower edge electrode by being positioned to be overlapped with the lower edge electrode when viewed from above,
wherein the channel distributor module includes a plurality of switches corresponding to the plurality of electrode units, respectively,
one end of the ground channel is connected with a ground, and another end of the ground channel is branched and is connected with the plurality of switches, respectively,
the other end of the ground channel is connected with a first end of each of the plurality of switches, respectively,
a second end of each of the plurality of switches is connected to a plurality of connection nodes, respectively,
each of the plurality of connection nodes is respectively connected to a separate electrode unit and connected to the impedance adjustment module in parallel, and
the electrode units are distributed to the ground channel or the tuning channel according to the switching of the plurality of switches.

2. The apparatus of claim 1, further comprising:
a connection line configured to connect the plurality of electrode units and the plurality of switches.

3. The apparatus of claim 1, wherein the one or more insulating units includes at least one of $ZrO_2$, AlN, $Al_2O_3$ polyethylene terephthalate (PETE), and PolyEtheretherKetone (PEEK).

4. The apparatus of claim 1, wherein the electrode units have an arc shape when viewed from above, and are arranged while being spaced apart from each other in a circumferential direction of the arc shape.

5. The apparatus of claim 1, wherein the electrode units have a ring shape when viewed from above.

6. The apparatus of claim 5, wherein the electrode units have the same center and have different radii when viewed from above.

7. The apparatus of claim 1, wherein the gas supply unit includes:
a first gas supply unit configured to supply inert gas to a center region of the substrate supported by the chuck; and
a second gas supply unit configured to supply the process gas to the edge region of the substrate supported by the chuck.

8. The apparatus of claim 1, further comprising:
a driving member configured to move the chuck in a vertical direction.

9. The apparatus of claim 1, wherein the dielectric plate is configured to be attached to a first base, the dielectric plate and first base together comprise a dielectric plate unit.

10. The apparatus of claim 9, wherein
the first edge electrode is configured to be attached to a second base, the first edge electrode and the second base together comprise an upper electrode.

11. The apparatus of claim 10, further comprising:
a temperature adjustment plate,
wherein the dielectric plate unit and the upper electrode are attached to the temperature adjustment plate.

12. The apparatus of claim 11, wherein
the temperature adjustment plate defines a plurality of flow paths through which at least one of a cooling fluid or cooling water is configured to flow.

13. The apparatus of claim 12, wherein
the first base and the second base comprise a material the same as the temperature adjustment plate.

14. The apparatus of claim 13, wherein
the first base and the second base comprise a material different from dielectric plate.

15. The apparatus of claim 9, wherein the process gas is configured to be supplied through a gas channel formed by spacing the dielectric plate apart from the first edge electrode.

16. The apparatus of claim 15, further comprising:
a first base and a second base spaced apart from each other above the dielectric plate and the first edge electrode, the first base and the second base further defining an upper portion of the gas channel.

17. The apparatus of claim 16, wherein
the gas channel has a discharge end to which the process gas is configured to be supplied to an edge region of the substrate.

* * * * *